United States Patent
Casey et al.

(10) Patent No.: US 7,294,909 B2
(45) Date of Patent: Nov. 13, 2007

(54) ELECTRONIC PACKAGE REPAIR PROCESS

(75) Inventors: Jon A. Casey, Poughkeepsie, NY (US); James G. Balz, Walden, NY (US); Michael Berger, New Paltz, NY (US); Jerome Cohen, Poughquag, NY (US); Charles Hendricks, Wappingers Falls, NY (US); Richard Indyk, Wappingers Falls, NY (US); Mark LaPlante, Montgomery, NY (US); David C. Long, Wappingers Falls, NY (US); Lori A. Maiorino, Wappingers Falls, NY (US); Arthur G. Merryman, Hopewell Junction, NY (US); Glenn A. Pomerantz, Kerhonkson, NY (US); Robert A. Rita, Manlius, NY (US); Krystyna W. Semkow, Poughquag, NY (US); Patrick E. Spencer, Rochester, NY (US); Brian R. Sundlof, Beacon, NY (US); Richard P. Surprenant, Poughkeepsie, NY (US); Donald R. Wall, Poughkeepsie, NY (US); Thomas A. Wassick, Lagrangeville, NY (US); Kathleen M. Wiley, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/099,161

(22) Filed: Apr. 5, 2005

(65) Prior Publication Data

US 2005/0176255 A1  Aug. 11, 2005

Related U.S. Application Data

(62) Division of application No. 10/358,431, filed on Feb. 4, 2003, now Pat. No. 6,916,670.

(51) Int. Cl.
*H01L 27/148* (2006.01)
*H01L 29/768* (2006.01)

(52) U.S. Cl. .............. 257/634; 257/650; 257/776; 257/E23.118; 257/E23.192; 257/E21.271; 257/E21.273

(58) Field of Classification Search ............ 257/776, 257/2, 632, 634, 650, E23.118, E23.192, 257/E21.271, E21.273; 438/4, FOR. 434
See application file for complete search history.

(56) References Cited

U.S. PATENT DOCUMENTS

| | | | |
|---|---|---|---|
| 4,680,615 A * | 7/1987 | Gotzenbrucker et al. ... | 257/496 |
| 4,911,796 A | 3/1990 | Reed | |
| 5,073,180 A * | 12/1991 | Farooq et al. ............ | 65/17.6 |
| 5,493,076 A * | 2/1996 | Levite et al. ............. | 174/261 |
| 5,552,607 A * | 9/1996 | Salisbury et al. ...... | 250/370.09 |
| 5,655,213 A * | 8/1997 | Natarajan et al. ........ | 428/568 |

(Continued)

*Primary Examiner*—Michelle Estrada
(74) *Attorney, Agent, or Firm*—Rosa S. Yaghmour

(57) ABSTRACT

A multilayer ceramic repair process which provides a new electrical repair path to connect top surface vias. The repair path is established between a defective net and a redundant repair net contained within the multilayer ceramic substrate. The defective net and the repair net each terminate at surface vias of the substrate. A laser is used to form post fired circuitry on and in the substrate. This is followed by the electrical isolation of the defective net from the electrical repair structure and passivation of the electrical repair line.

14 Claims, 10 Drawing Sheets

U.S. PATENT DOCUMENTS

| | | | |
|---|---|---|---|
| 5,710,460 A * | 1/1998 | Leidy et al. | 257/752 |
| 5,757,079 A * | 5/1998 | McAllister et al. | 257/776 |
| 5,948,192 A | 9/1999 | Ikuina et al. | |
| 6,262,390 B1 | 7/2001 | Goland et al. | |
| 6,270,601 B1 | 8/2001 | Ritland et al. | |
| 6,316,116 B1 | 11/2001 | Nakamura et al. | |
| 6,335,077 B1 | 1/2002 | Tani et al. | |
| 6,427,324 B1 * | 8/2002 | Franklin et al. | 29/852 |
| 6,713,686 B2 * | 3/2004 | Becker et al. | 174/262 |
| 2003/0136581 A1 * | 7/2003 | Becker et al. | 174/262 |

\* cited by examiner

ELECTRONIC PACKAGE REPAIR PROCESS

This application is a divisional of U.S. application Ser. No. 10/358,431, filed Feb. 4, 2003, now U.S. Pat. No. 6,916,670.

BACKGROUND OF THE INVENTION

The present invention is directed to electronic packaging and, more particularly, is directed to a method to repair defective electrical connections in a multilayer ceramic package.

Multilayer Ceramic ("MLC") substrates may contain thousands of electrical connections. There are numerous manufacturing problems which can result in a defective electrical circuit, or "net", within an MLC substrate. The two most common defects are simple open circuits or shorted circuits. Once an MLC substrate has been fired, it is very difficult to repair an electrical defect since the defective electrical connection is contained within the substrate. The current method used to repair a defective electrical net is to build a new electrical connection on the top surface of the substrate using conventional thin films technology. This method often involves building a multilayer repair structure on the top surface of the MLC substrate. While the thin film repair technology is very effective, it is also costly due to the number of process steps and high resolution tooling required.

Therefore, there is a need for a low cost alternative to repair defective electrical connections or nets in MLC substrates. Accordingly, it is a purpose of the present invention to provide a novel process to repair defective nets within an MLC substrate. The method involves using numerically controlled tooling to define and form an electrical connection between a defective net within an MLC substrate to a repair net. This repair net is a redundant net placed within the MLC substrate. This new repair method does not rely on thin film structures; rather the repair is embedded into the surface of the MLC substrate through a laser ablation process and metal deposition process.

BRIEF SUMMARY OF THE INVENTION

The purposes and advantages of the present invention have been achieved by providing a method to repair defective electrical connections in a multilayer ceramic substrate comprising the steps of: defining an electrical repair path for a multilayer ceramic substrate; forming a trench in a top surface of the multilayer ceramic substrate with a laser, the trench having a first end defined by a defective top surface via and a second end defined by a repair net top surface via; laser ablating the defective top surface via to a first desired depth; laser ablating the repair net top surface via to a second desired depth; etching the defective top surface via to remove any remaining metal to a third desired depth; filling the defective top surface via with an insulating material; and depositing a conductive metal in the trench and in the repair top surface via and the defective top surface via to a desired thickness to create an electrical repair. The method may further include polishing the top surface to remove excess deposited conductive metal from the electrical repair; and applying a dielectric material over the electrical repair.

The present invention is not limited to electrical repair applications. Accordingly, the present invention also provides a method to create new or alternate electrical connections for a multilayer ceramic substrate which comprises the steps of defining an electrical connection in a multilayer ceramic substrate; forming a trench in a top surface of the multilayer ceramic substrate with a laser, the trench having a first end defined by a first via and a second end defined by a second via; laser ablating the first via to a first desired depth; laser ablating the second via to a second desired depth; depositing a conductive metal in the trench and in the repair via to a desired thickness to create an electrical connection. The method may further include polishing the top surface to remove excess deposited conductive metal from the electrical connection; and applying a dielectric material over the electrical connection.

In addition, the present invention also provides a multilayer ceramic substrate repair structure comprising; a multilayer ceramic substrate having a plurality of top surface vias; a trench formed in a top surface of the multilayer ceramic substrate with a laser, the trench having a first end defined by a defective top surface via and a second end defined by a repair top surface via, the first and second vias laser ablated to a desired depth; an insulating material filling the defective top surface via to the desired depth; and a conductive metal filling the trench and repair top surface via and defective top surface via to create an electrical repair. The repair structure may further comprise a dielectric material over the electrical repair.

These and other purposes of the present invention will become more apparent after referring to the following description considered in conjunction with the accompanying drawings.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
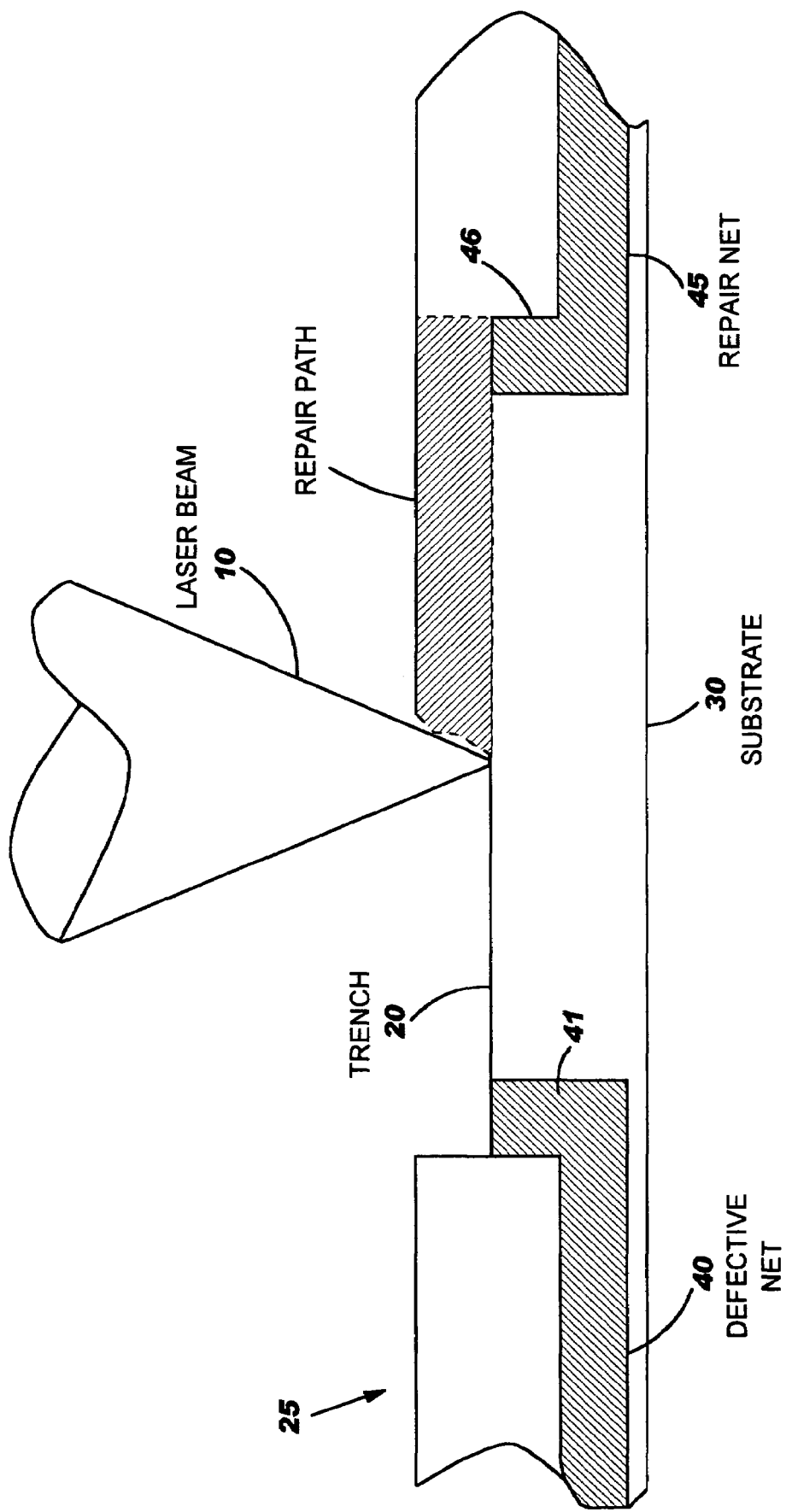
FIG. 1 is an enlarged, partial cross-sectional view of a substrate illustrating laser ablation of a repair path.

The present invention have been achieved by providing a novel repair process which provides a new electrical repair path to connect top surface vias on a fired multi-layer ceramic ("MLC") substrate. The repair path is established between a defective net and a redundant repair net contained within the MLC substrate. The defective net and the repair net each terminate at surface vias of the MLC substrate. The method allows for the formation of post fired circuitry on and in MLC substrates without the use of expensive thin film tooling or technology. Electrical repairs using this novel process allow defective nets to be re-routed to spare or redundant nets within the substrate and recover an otherwise defective substrate.

The first step is the definition of an optimum electrical repair path. This is followed by the formation of the electrical repair structure and electrical isolation of the defective net from the electrical repair structure. The repair is metallized and any extraneous metal removed. This is followed by the electrical isolation of the repair net surface pad above the defective net from the chip interconnect (C4), as well as passivation of the electrical repair line. Finally, the terminal metal of the repair surface pad is plated. This process is now described in more detail with reference to the accompanying figures.

In a typical MLC substrate, the number of potential repair paths will be quite numerous. In a preferred embodiment of the present invention, direct digital definition of the repair path and structure is used. Direct digital definition uses a routing program to establish the shortest repair path available between each defective net. Using predefined electrical performance parameters, the router establishes the wiring solution, i.e., the repair path and repair geometry. The router creates a graphical image of the repair path, and then outputs a data file containing all the required information for the repair tools to create the repair. The repair tools, such as a laser and micro-dispense tool, process the data output from the design router and create the repair using this data to operate their numerically controlled alignment to translation stages.

Direct digital processing of the repair allows for the design of the repair to be conducted using automated design software. The numerical digital design data is then transferred to numerically controlled tooling used to form the repair structure. Digital processing of the design and repair allows one to establish the optimum repair path, while avoiding the need for many hard tooling requirements such as the costly masks used in photo processing of patterns. The repair is established in the MLC substrate through a laser ablation process. Establishing the repair structure below the top surface of the fired ceramic allows for low cost blanket metallization schemes to be applied. This results in the repair structure being metallized below the surface of the fired MLC substrate and the excess surface metal being removed by a conventional polishing process. This allows for the elimination of costly patterning processes such as the use of photo resists or reactive ion etching.

The electrical repair design is the first step of the process. The purpose of electrical repair design is to establish an optimal repair path based on the location of the electrically defective net in relation to the location of redundant repair nets built into the original MLC substrate. An automatic routing program establishes the shortest repair path available, and dependent upon the total length of the repair path, will establish whether a single line repair or a dual line repair is required to meet the electrical specifications of the repaired system. Automatic routing programs are commonly used for the design of MLC substrates, including thin films layers, as well as integrated chip designs.

The overall length of the repair influences the electrical performance, e.g., impedance, time of flight, of the repaired structure. The repaired structure is defined as the repair lines and the repair net. The longer the repair line, the more impact the repair line will have on the overall electrical performance. To minimize the effect of the repair line on the electrical performance, dual repair lines are used for repairs which require longer lengths. The dual structure lowers the repair line impedance by approximately 50%, which more closely matches the electrical characteristics, such as impedance, of the repair line with respect to that of the redundant repair net. Once the repair design is established, the data is transferred over to the next processing tool, a laser. For simplicity, the following examples will illustrate the formation of single line repairs.

Referring now to FIG. 1, a laser beam 10 is used to form a trench 20 on the surface 25 of a substrate 30. The substrate surface needs to be relatively flat since the substrate will later be polished to remove excess repair metal. If the substrate camber, or deviation from surface flatness, is greater than the depth of the repair trench, the substrate may require a surface lapping or polishing prior to trench formation to insure the top surface is coplanar.

The trench 20 defines the path of a desired repair conductor from a defective metal net 40 and defective metal net via 41 to an alternate repair metal net 45 and repair metal net via 46. In a preferred embodiment a XeCl excimer laser operating at a wavelength of approximately 308 nm is used to create the electrical repair structure. The present repair strategy centers around the use of an excimer laser with a uniform beam profile. Unlike typical Gaussian beam systems used for cutting or shaping materials, this system enables various trench widths to be defined by directly controlling aperture blades positioned in the beam path. Gaussian beam systems normally require the use of multiple, incrementally spaced passes to achieve kerf or trench widths which adds unnecessary time and cost to the process. The use of a uniform beam profile also eliminates depth or penetration control problems associated with the high energy region of most Gaussian beam systems. Alternate laser types, such as Nd-YAG and CO2, have been investigated and shown to also be effective in the trench formation process. However, precise control of the trench geometry with the alternate laser systems tested to date are inferior.

The MLC substrate is placed within a conventional, precision three axis controlled stage (not shown) well known in the art and aligned using surface fiducials or alignment features (not shown). Alignment fiducials are well known in the art and are typically located in the perimeter region of the top or bottom surface of the MLC substrate. After alignment is completed, a trench 20 is ablated, based on the routing data, into the ceramic between the defective net's top surface via 41 to the top surface via of the repair net 46. Controlling the geometry of the ablated trench is desirable since the trench geometry establishes the overall geometry of the repair, and as such, the final electrical performance of the repair.

In a preferred embodiment the trench width and trench depth is independently controlled to a tolerance of approximately +/−1 micron using available excimer laser technology. Optimal trench geometry's can be established based on the electrical performance requirements as well as available top surface spacing. The available top surface spacing will depend on the C4 pad size and spacing as well as other possible surface design features. In a preferred embodiment the typical trench width is approximately 40 μm (microns) and the typical trench depth is approximately 18 μm (microns).

Figure 2:
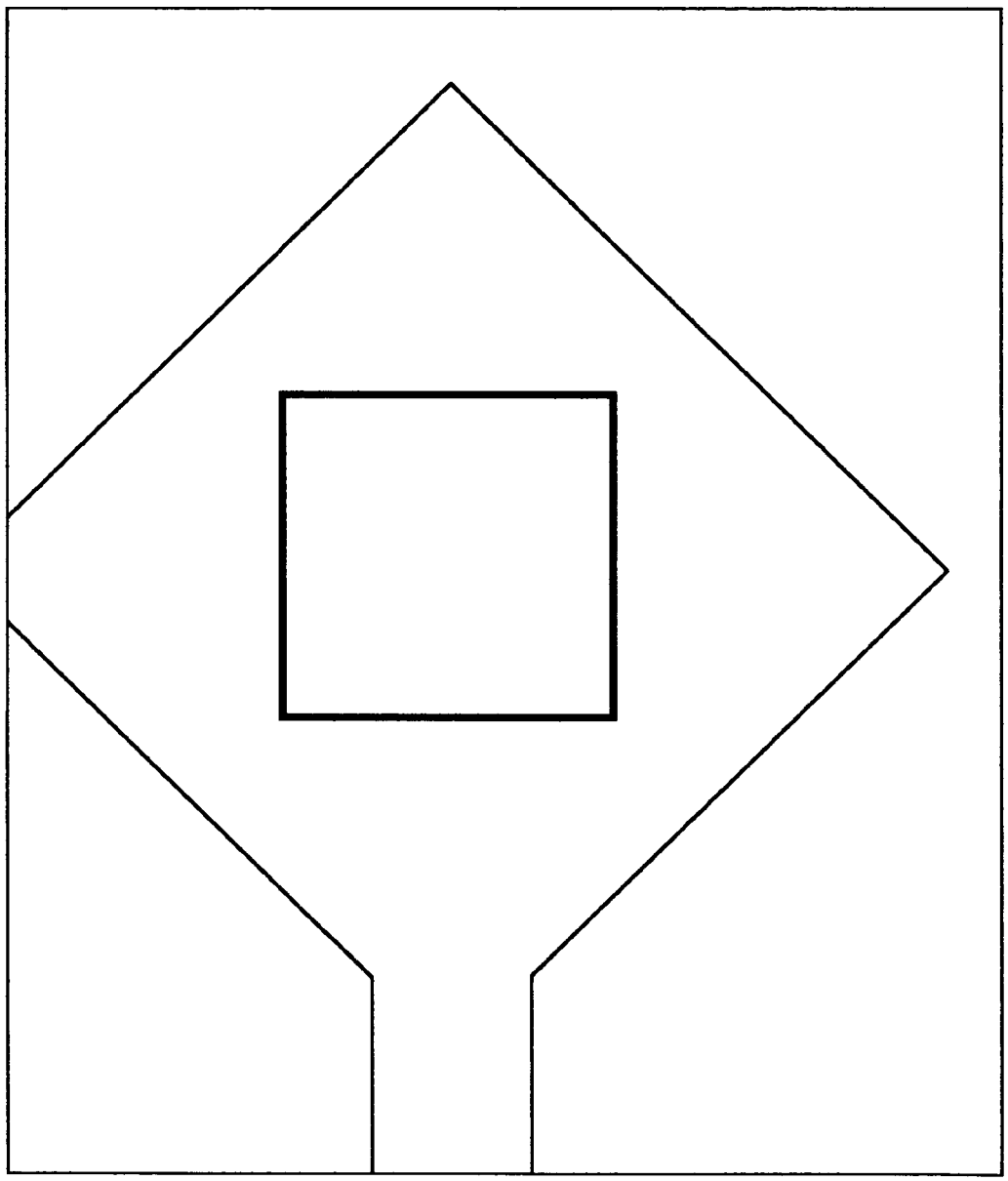
FIG. 2 is a micrograph of an ablated trench and terminal pad.

In addition to ablation of the repair trench, both ceramic and metal are ablated at the terminal vias of the repair to define new top surface electrical connect pads for the repair. Upon completion of the laser ablation process, the repair consists of diamond shape cavities ablated at each terminal via, as well as a connecting trench ablated into the ceramic connecting the two terminal pad cavities. Typical micrographs of ablated trenches and terminal pads are shown in FIG. 2. The via in FIG. 2 has also been etched and passivated.

Referring again to FIG. 2, the surface via opening is preferably larger than the via diameter. In a preferred embodiment the via is 100 μm in diameter while the surface opening is diamond shaped and approximately 175 μm in size. The larger size provides an area of ceramic around the via which provides good metal to ceramic adhesion of the repair pad to the substrate surface. The larger size also provides an area around the via of continuous metal which minimizes thermal stresses at the trench-via interface. This advantage of an oversized repair pad is because the repair trench goes into a pad which is bonded to the underlying ceramic as opposed to the repair trench going directly into the via. Vias may move vertically during thermal cycles which create thermal stresses.

Figure 3:
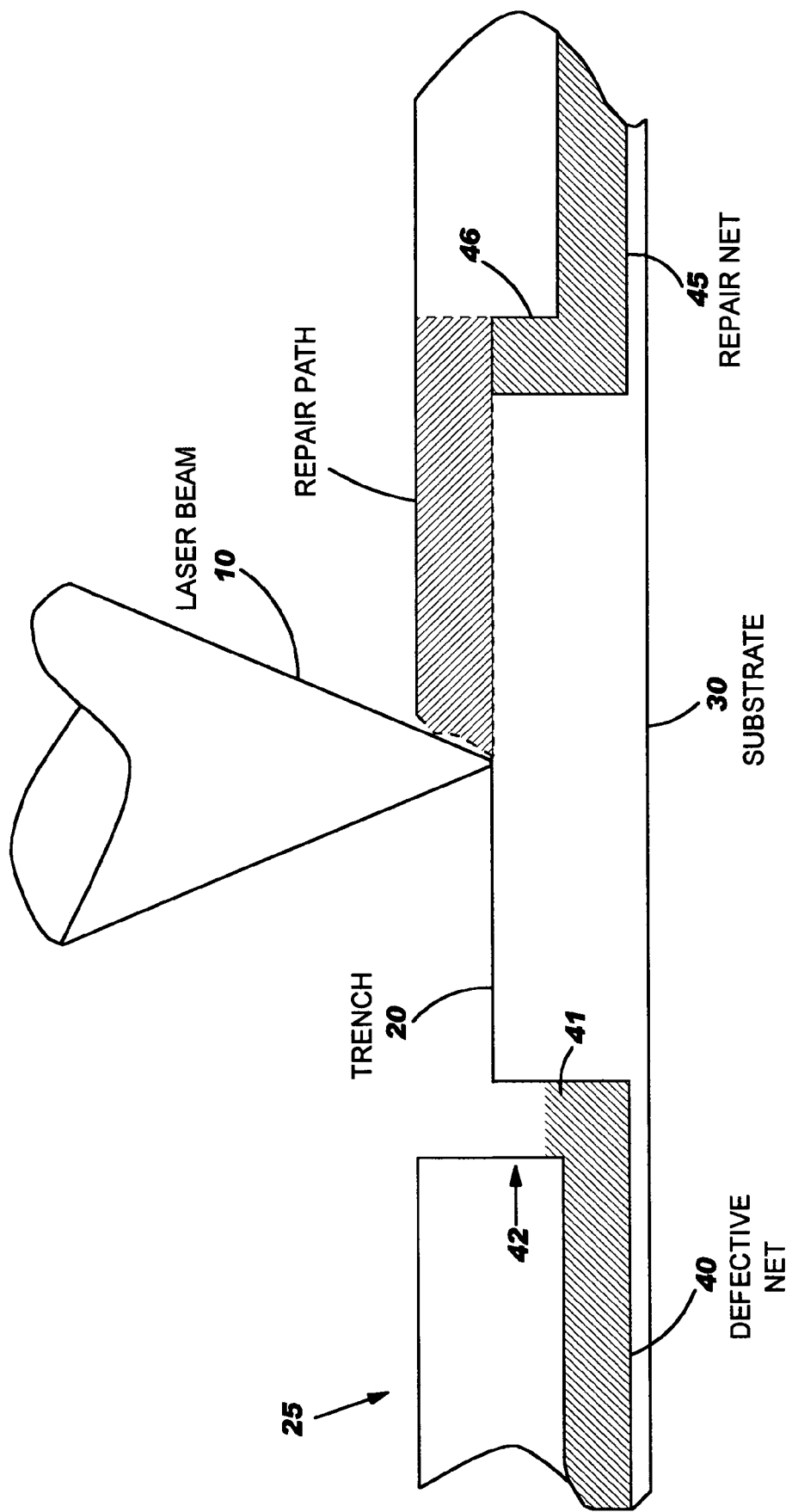
FIG. 3 is an enlarged, partial cross-sectional view of a substrate illustrating selective chemical etching of the defect net via
Figure 4:
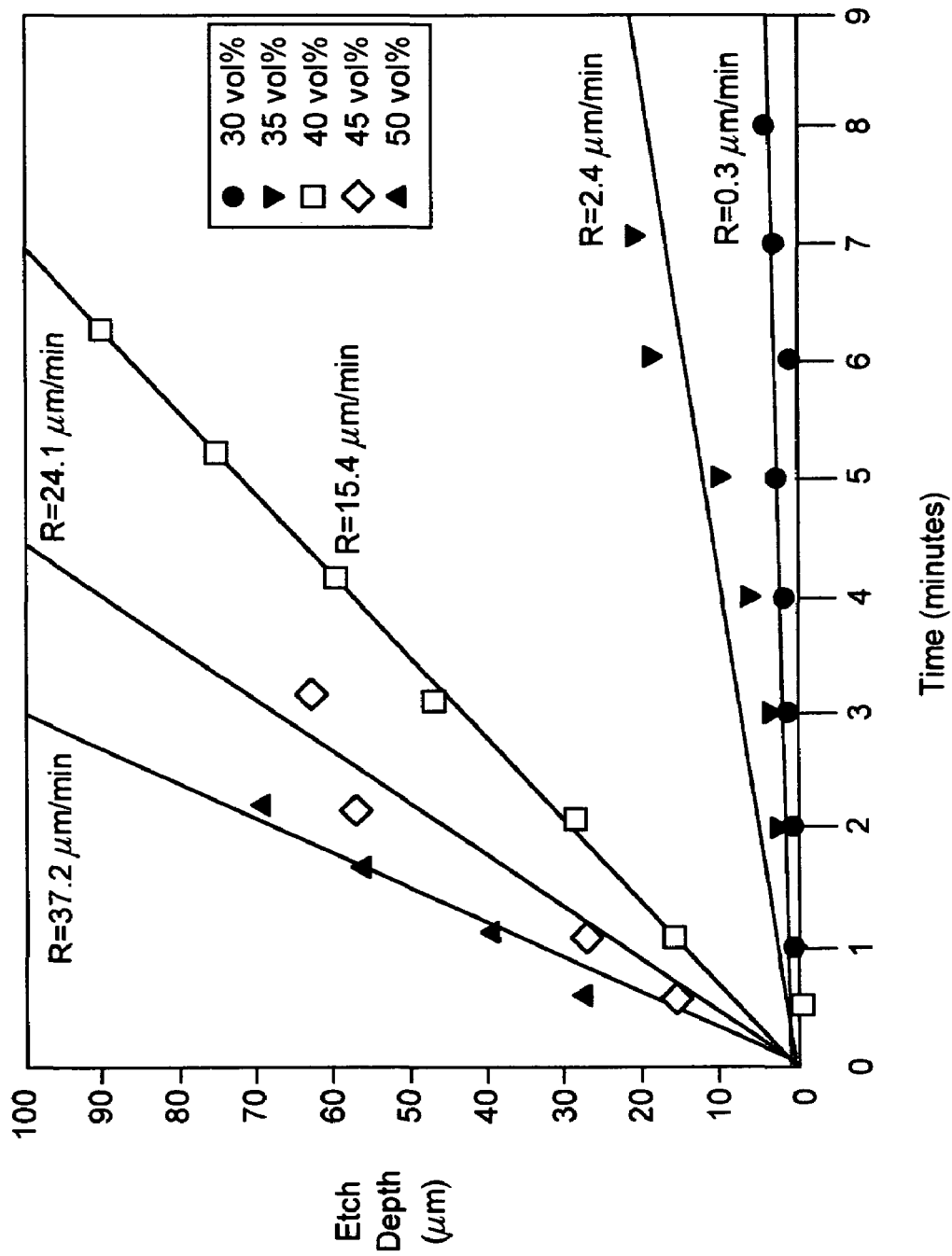
FIG. 4 is a graph of alternate acid concentrations.

Since laser ablation of metal from the via structures can not insure complete removal of all metal, laser ablation alone is not a reliable means to isolate the defective net. To accomplish this, a selective chemical etch of the defective net via 41 is employed. Using a conventional acid etching process, all metal from the defective net via 41 is chemically removed to a finite depth 42, as shown in FIG. 3, depending upon etch times and concentration of the acid. In a preferred embodiment, a 40% by volume nitric acid etchant solution is used to etch copper based vias. Alternate acid concentrations can be utilized as shown in FIG. 4. Additionally, alternate acid types, e.g., hydrochloric, acetic, etc., can be utilized for acid etch depending upon the via metallurgy type.

Acid etching is only applied to the vias of the defective nets since these nets need complete electrical isolation from the repair structure. In a preferred embodiment, this is accomplished by applying tape (not shown) over the repair area and laser ablating an opening in the defective net via, allowing only the etchant to reach the defective net via. After completion of the acid etching, the repair structure now consists of the laser defined repair trench, terminal pad structures and an etched via hole which contains no metallurgy for a finite depth below the repair structure.

Figure 5:
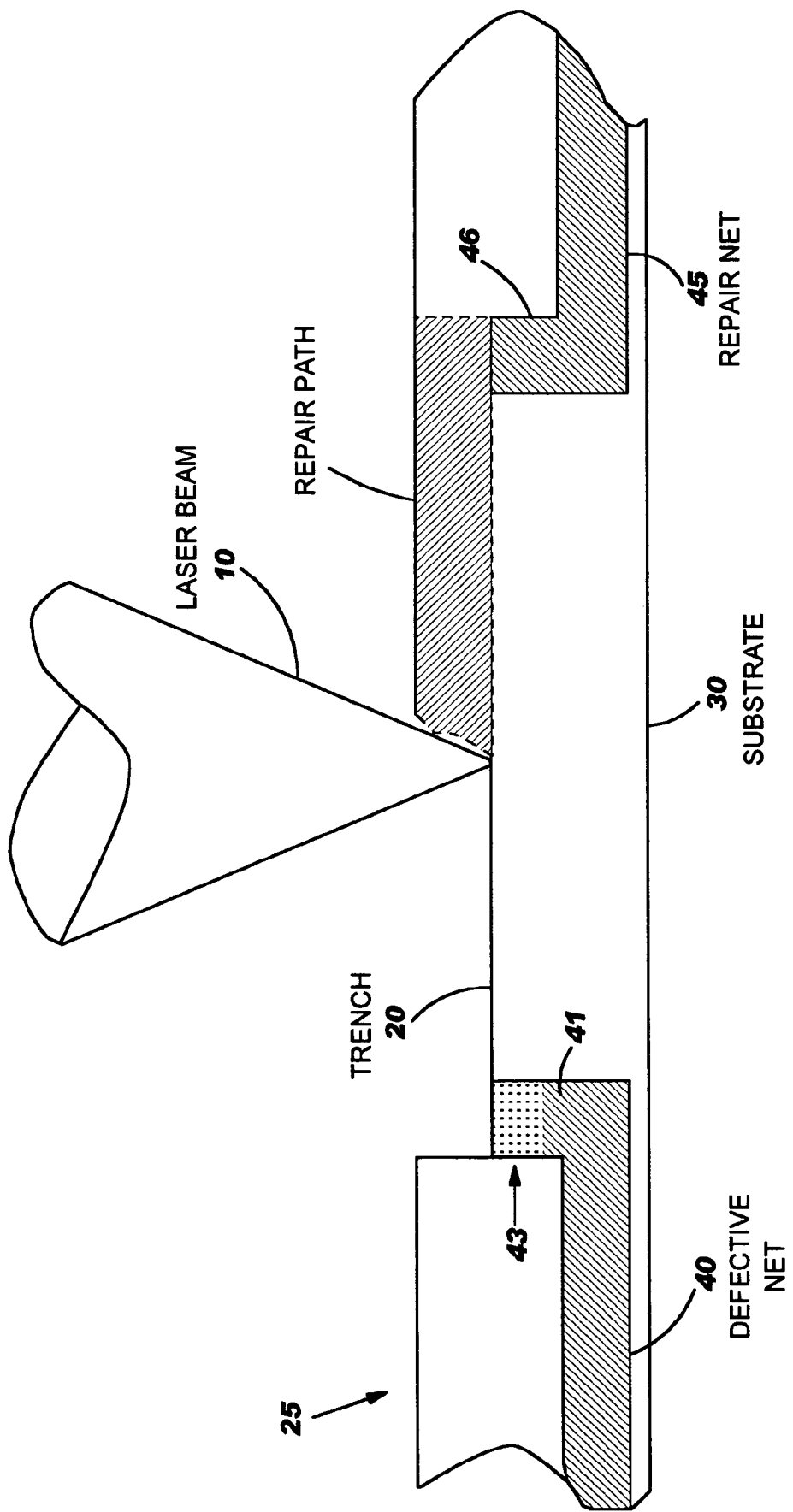
FIG. 5 is an enlarged, partial cross-sectional view of a substrate illustrating via passivation.

The next step in the process is "Via Passivation". This term describes the electrical isolation of the repair structure from the defective net. To insure electrical isolation or passivation, the etched via is completely filled with a dielectric material 43, as shown in FIG. 5. Complete fill of the via is required to insure that the defective net is electrically isolated. As such, the rheological and/or thermal reflow behavior of the dielectric material is an important characteristic. In addition, the dielectric material 43 must be able to survive all subsequent thermal processing steps required for conventional MLC substrates such as chip joining and thermal cycling, which is typically in the range of −55 to 375° C. In a preferred embodiment, Matrimid 5292 (Vantico Corporation, Brewster N.Y.) is used as the via passivation material 43. A 25% by weight solution of Matrimid 5292 in N-methy 2-pyrrolidone (NMP) is used to fill the etched via. The NMP is removed through evaporation and the resulting Matrimid is thermally cured. Alternate polymer chemistries would be readily apparent to those skilled in the art.

In addition to organic passivation materials, inorganic passivation materials can be used for via passivation. In a preferred embodiment (not shown), a silicate based glass (such as Corning Glass Code 7070) powder can be used to passivate vias. Via fill is accomplished by making up an approximate 50% by volume suspension of the glass in a suitable solvent such as water or an organic solvent, and filling the via through capillary action. Alternate glass compositions are available to those skilled in the art. In another preferred embodiment, glass micro-spheres, (such as available from SPI Supplies, West Chester Pa.) can be placed into the etched vias and thermally reflowed to fill the vias. In a preferred embodiment the thermal reflow is conducted at 900° C. for 1 hour.

Precise fill can be accomplished by controlling the diameter and number of micro-spheres added to the etched via. As an example, in the case of 100 μm vias, micro-spheres in the range of 20-75 μm were used. The number of micro-spheres is determined by the volume of passivation fill required and the volume of the micro-spheres being used. In a preferred embodiment a 20 μm passivation thickness in the via column is used to insure good electrical isolation. The microspheres can be placed in the vias manually or can be placed using micro-tubes, such as hypodermic needles, as funnels.

Precise control of the passivation fill height is desirable since the via passivation material should ideally fill the etched via but not interfere with the metallization of the top surface pad. To achieve the desired process control, the etched via structure can initially be overfilled to insure that complete passivation of the defective via column is achieved. After fill and curing/reflow of the via passivation material, the excess via passivation material can be laser ablated, using the previously discussed laser tooling, to a depth just below the bottom surface of the ablated trench and pad structure (e.g., 20 microns from top surface of the ceramic). The resulting structure, as shown in FIG. 5, now consists of the defective via column 41 which contains the desired amount of via passivation material 43 to insure electrical isolation, and the previous described terminal pad and trench structures.

Figure 6:
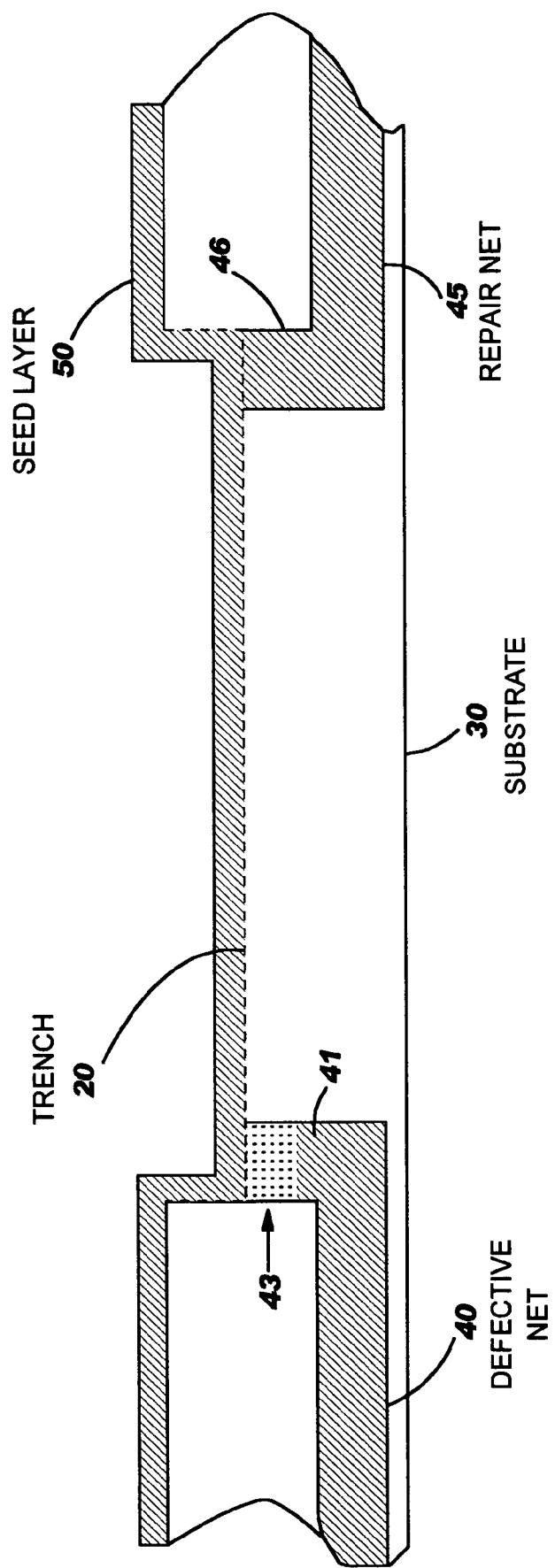
FIG. 6 is an enlarged, partial cross-sectional view of a substrate illustrating deposition of a seed layer in the repair path.

The next step is the metallization of the repair structure. Since the entire repair structure has been defined below the original surface of the MLC substrate, any conventional blanket metallization scheme can be used to metallize the entire surface of the substrate, as well as the substrate repair structure. To insure excellent ceramic to metal adhesion, in a preferred embodiment, once the trench 20 is formed, a seed layer 50, shown in FIG. 6, is evaporated or preferably sputtered, covering at least a portion of the surface of the substrate and subsequently the bottom and sides of the laser formed trench 20. This seed layer provides adhesion of the repair metallurgy to the repair path side-walls as well as an electrically conductive path to the edge of the substrate 30 for connection to the plating potential required for subsequent electroplating steps. A preferred metallization process consists of the blanket Cr-Cu sputtering of a seed layer followed by a low cost electrolytic copper plating enabling complete fill of the sub-surface repair structure with copper.

Figure 7:
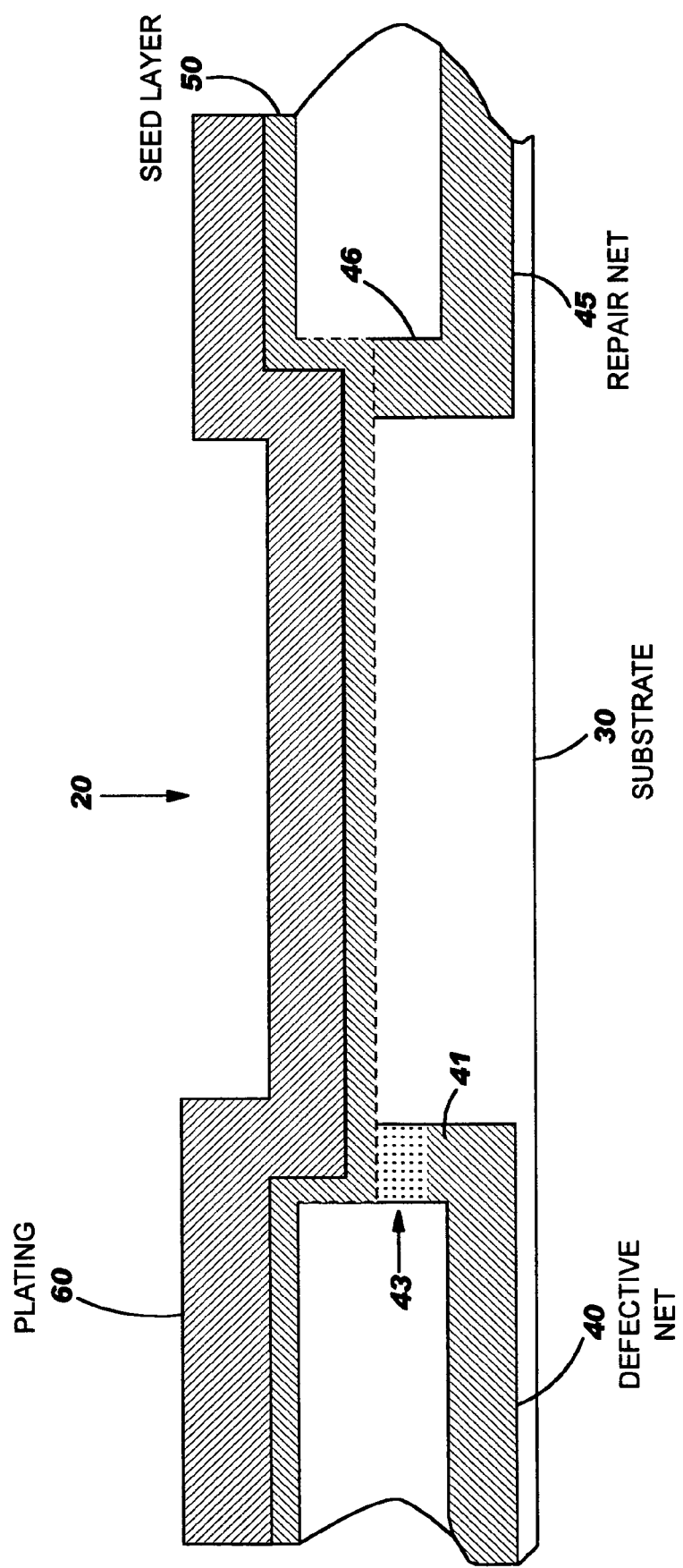
FIG. 7 is an enlarged, partial cross-sectional view of a substrate illustrating the deposition of conductive metal in the repair path.

The trench 20 is then completely filled by either continued sputtering of the desired metallurgy, or preferably, electroplated as shown in FIG. 7. The added metallurgy 60 is formed on at least a portion of the surface of the substrate 25 as well as in the laser formed trench 20, at the full thickness required to fill the trench.

Alternate metallization processes are also possible using post-fire metallurgical pastes. In a preferred embodiment (not shown), a paste containing 60% by volume glass and 40% by volume copper is extruded into the trench structure using a squeegee and then fired in an inert or reducing environment to 850° C. to density the paste into a conductive repair. The glass is used as a bonding agent to insure excellent adhesion of the repair to the original MLC substrate.

Figure 8:
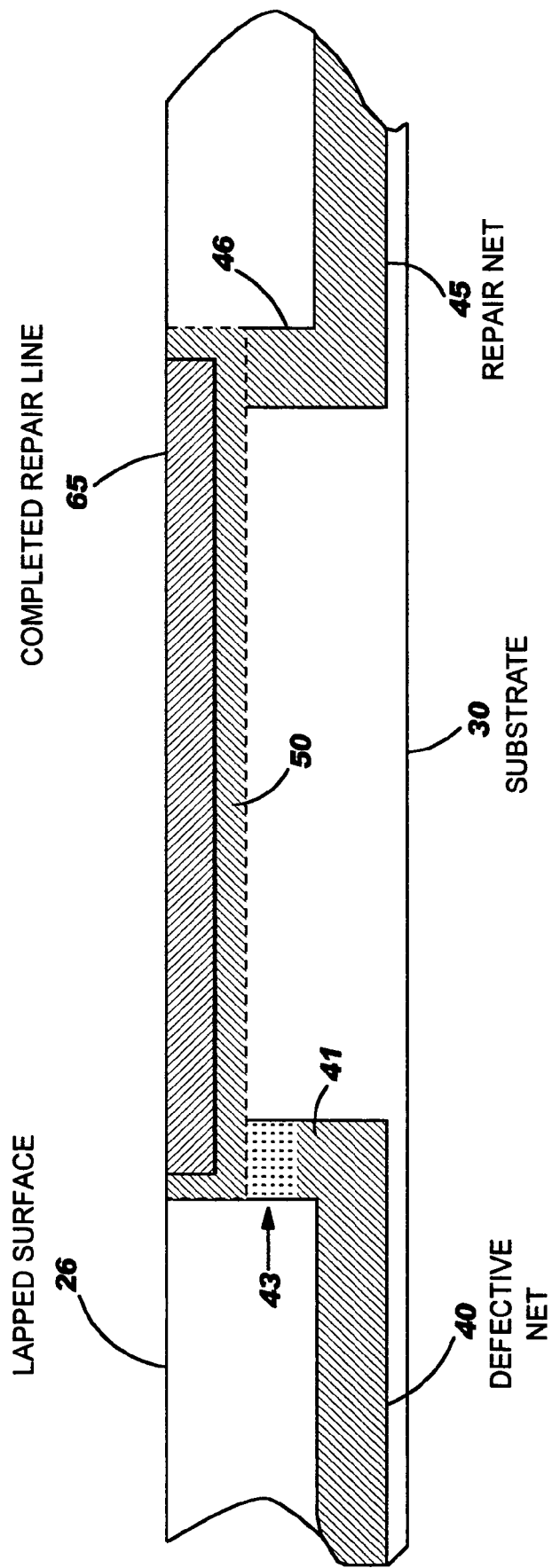
FIG. 8 is an enlarged, partial cross-sectional view of a substrate illustrating the removal of excess metal from the polished surface of the substrate.

Following metallization the substrate 30 may be polished to remove the undesired metallurgy residing on the surface of the substrate 25 to expose and isolate just the repair conductor metallurgy 65 in the now filled trench as shown in FIG. 8. Conventional metal polishing processes can be utilized to remove excess metal from the polished surface 26 of the substrate. Since the original substrate was required to be flat, the polishing process can simply polish back down to the original substrate surface and obtain precise control of the polish depth. Upon completion of the polishing process, the electrical connection of the repair has been completed.

Figure 9:
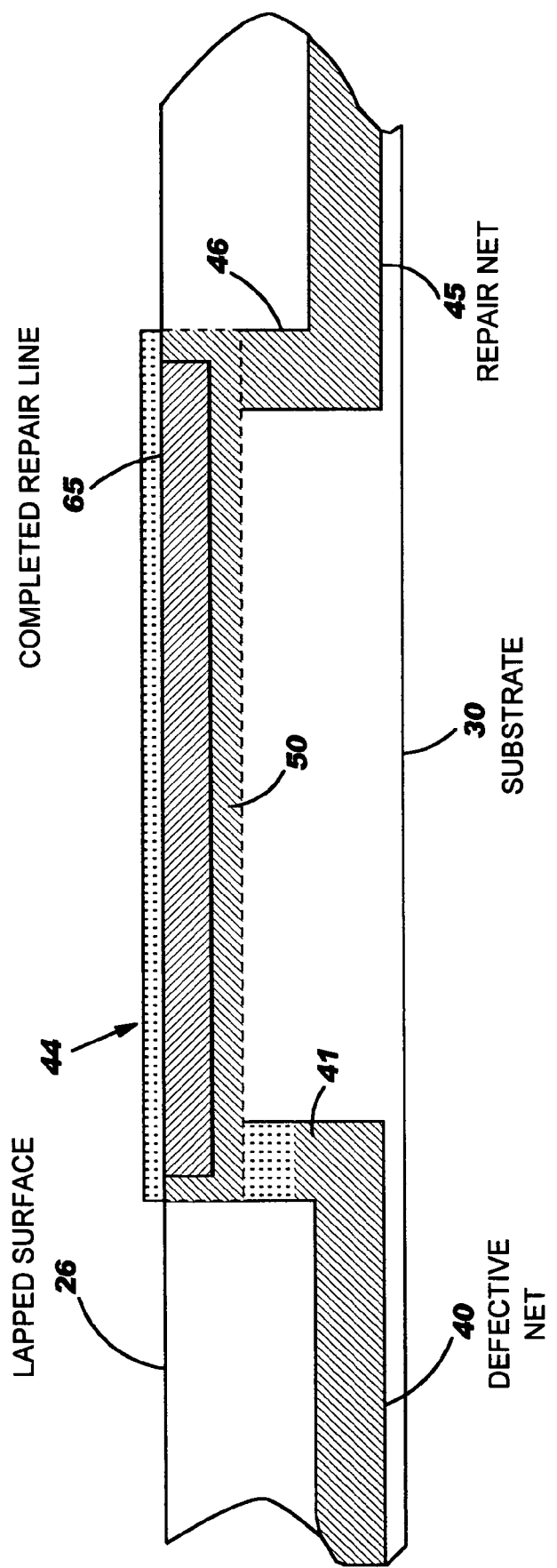
FIG. 9 is an enlarged, partial cross-sectional view of a substrate illustrating the passivation of the repair.

Referring now to FIG. 9, repair passivation may also be performed. In this step a polyimide based dielectric material 44 is applied over the electrical repair 65. This repair passivation serves several functions. First and foremost is electrical isolation to prevent chip interconnection to the repair pad over the top of the internal repair net. Isolation of this pad is required if an electrical connection to the chip is being made to this net through the repair pad above the original defective net.

The second function of the repair passivation is to physically cover the repair line which prevents plating of the repair with terminal metallurgy (e.g., Ni-Au). Plating of the repair provides minimal electrical benefits and can induce residual stresses due to the higher elastic modulus of the plated nickel as well as thermal stresses due to thermal expansion differences. Finally, the repair passivation eliminates the possibility of shorting of the repair to adjacent vias during chip joining and or chip rework processes.

Top surface repair passivation is accomplished by applying a polyimide based dielectric material over the required portions of the repair structure. This is accomplished by using a digitally controlled micro-dispense tool which can utilize the original routing data which enables the micro-dispense tool to write a line of polyimide over the repair structure. One such tool is the "Micropen" tool manufactured by Ohm Craft (Honeoye Falls, N.Y. 14472). This tool utilizes a positive displacement dispense system to dispense a liquid or suspension through a micro-dispense tip. Part alignment and movement is controlled through a numerically controlled X/Y precision stage. Due to the dimensional control requirements and spacing criteria, any excess passivation material must be trimmed and removed using the laser tool.

Figure 10:
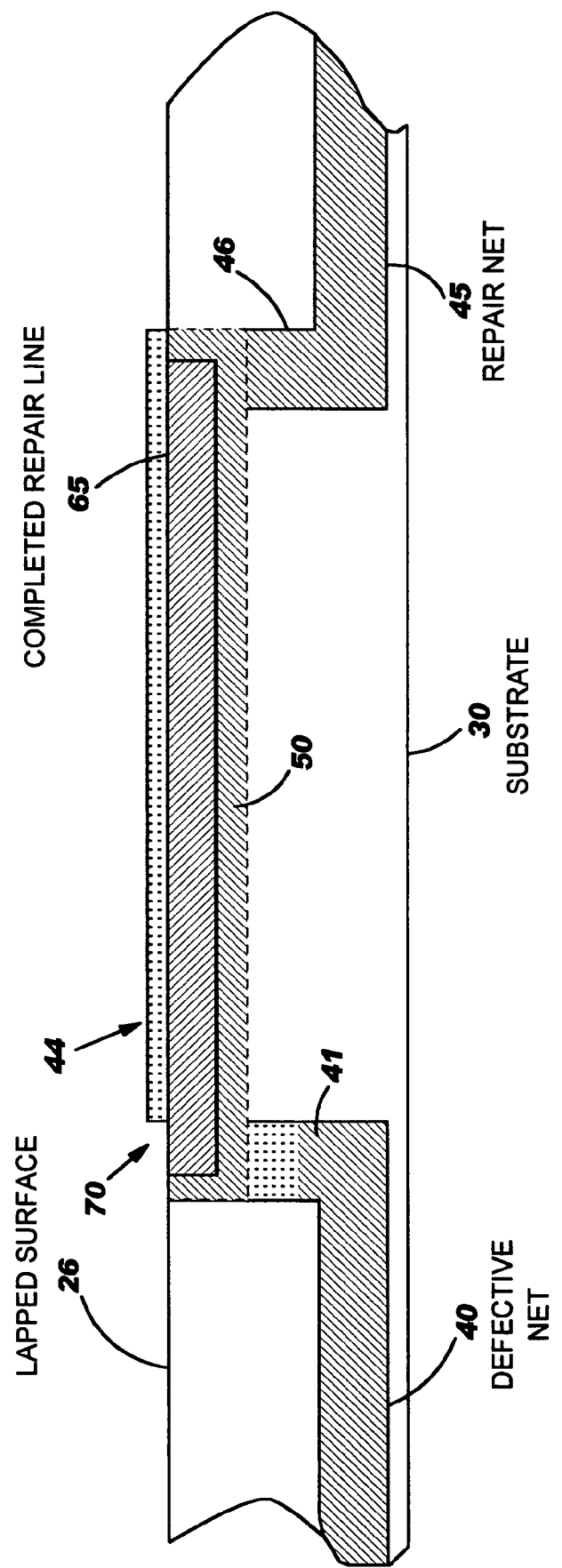
FIG. 10 is an enlarged, partial cross-sectional view of a substrate illustrating a completed repair.

Upon completion of the repair passivation, the repair is essentially complete. In one embodiment, only the repair line is passivated, and the repair via is not passivated. In another embodiment, as shown in FIG. 9, both the repair line and the defective net via are passivated. For this embodiment an opening 70 in the repair passivation 44, as shown in FIG. 10, is ablated through the passivation material over the defective net via 41. This opening 70 allows for electrical connection of a chip or device (not shown) to the defective site, but the repair line then re-routs the electrical path to the repair net 45. The repaired structure can proceed to terminal metal plating and electrical parametric testing to insure the repaired net meets the same electrical performance specifications as the original electrical design criteria.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayer ceramic substrate repair structure comprising:
   a multilayer ceramic substrate having a plurality of top surface vias;
   a trench formed in a top surface of said multilayer ceramic substrate with a laser, said trench having a first end defined by a defective top surface via and a second end defined by a repair top surface via, said first and second vias laser ablated to a desired depth;
   an insulating material comprised of a silicate based glass powder filling said defective top surface via to said desired depth; and
   a conductive metal filling said trench and said repair top surface via and said defective top surface via to create an electrical repair, wherein said conductive metal is a metallurgical paste extruded into said trench and said repair top surface via.

2. The multilayer ceramic substrate repair structure of claim 1 further comprising a dielectric material over said electrical repair.

3. The multilayer ceramic substrate repair structure of claim 1 wherein said trench is approximately 40 μm in width and approximately 18 μm in depth.

4. The multilayer ceramic substrate repair structure of claim 1 further comprising a seed layer in said trench and in said repair top surface via and in said defective top surface via underlying said conductive metal.

5. The multilayer ceramic substrate repair structure of claim 4 wherein said seed layer is a layer of Cr—Cu.

6. The multilayer ceramic substrate repair structure of claim 1 wherein said conductive metal is a layer of electrolytic plated copper.

7. The multilayer ceramic substrate repair structure of claim 1 wherein said conductive metal is comprised of 60% by volume glass and 40% by volume copper.

8. A multilayer ceramic substrate repair structure comprising:
   a multilayer ceramic substrate having a plurality of top surface vias;
   a trench formed in a top surface of said multilayer ceramic substrate with a laser, said trench having a first end defined by a defective top surface via and a second end defined by a repair top surface via, said first and second vias laser ablated to a desired depth;
   an insulating material comprised of glass micro-spheres filling said defective top surface via to said desired depth; and
   a conductive metal filling said trench and said repair top surface via and said defective top surface via to create an electrical repair, wherein said conductive metal is a metallurgical paste extruded into said trench and said repair top surface via.

9. The multilayer ceramic substrate repair structure of claim 8 further comprising a dielectric material over said electrical repair.

10. The multilayer ceramic substrate repair structure of claim 8 wherein said trench is approximately 40 μm in width and approximately 18 μm in depth.

11. The multilayer ceramic substrate repair structure of claim 8 further comprising a seed layer in said trench and in said repair top surface via and in said defective top surface via underlying said conductive metal.

12. The multilayer ceramic substrate repair structure of claim 11 wherein said seed layer is a layer of Cr—Cu.

13. The multilayer ceramic substrate repair structure of claim 8 wherein said conductive metal is a layer of electronic plated copper.

14. The multilayer ceramic substrate repair structure of claim 8 wherein said conductive metal is comprised of 60% by volume glass and 40% by volume copper.

* * * * *